(12) United States Patent
Shepherd

(10) Patent No.: US 9,941,328 B2
(45) Date of Patent: *Apr. 10, 2018

(54) OPTICAL DEVICE HAVING MESAS FOR LIGHT EXTRACTION ENHANCEMENT

(71) Applicant: Oculus VR, LLC, Menlo Park, CA (US)

(72) Inventor: Nick Shepherd, Birgitz (AT)

(73) Assignee: Oculus VR, LLC, Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/248,601

(22) Filed: Aug. 26, 2016

(65) Prior Publication Data

US 2016/0365383 A1    Dec. 15, 2016

Related U.S. Application Data

(63) Continuation of application No. 14/425,414, filed as application No. PCT/EP2013/067187 on Aug. 16, 2013, now Pat. No. 9,450,148.

(30) Foreign Application Priority Data

Sep. 3, 2012  (GB) .................................. 1215632.9

(51) Int. Cl.
*H01L 33/00*   (2010.01)
*H01L 27/15*   (2006.01)
(Continued)

(52) U.S. Cl.
CPC ........ *H01L 27/156* (2013.01); *H01L 27/1446* (2013.01); *H01L 27/153* (2013.01);
(Continued)

(58) Field of Classification Search
CPC ....... H01L 25/075; H01L 27/15; H01L 33/08; H01L 33/00
(Continued)

(56) References Cited

U.S. PATENT DOCUMENTS 7,518,149 B2    4/2009  Maaskant et al.
9,450,148 B2 *  9/2016  Shepherd .......... H01L 31/02325
(Continued)

FOREIGN PATENT DOCUMENTS

DE           19963550       7/2001
WO    WO 2004/097947 A2    11/2004

OTHER PUBLICATIONS

Pocius, Forming an optical element on the surface of a light emitting device for improved light extraction, US20020141006.
(Continued)

*Primary Examiner* — Tan N Tran
(74) *Attorney, Agent, or Firm* — Fenwick & West LLP

(57) ABSTRACT

An optical device and method for fabricating an optical device. The optical device comprising: a semiconductor material comprising an active layer configured to emit light when an electrical current is applied to the device and/or to generate an electrical current when light is incident on the active layer, wherein the semiconductor material comprises a first surface and an opposed second surface, from which light is emitted from and/or received by the device, and wherein the first surface defines a first structure comprising the active layer and configured to reflect light emitted from the active layer toward the second surface and/or to reflect light received by the device toward the active layer, and the second surface defines a second structure configured to permit light incident on the second surface at an angle outside a critical angle range to the planar normal to pass therethrough.

19 Claims, 6 Drawing Sheets

(51) Int. Cl.
| | |
|---|---|
| *H01L 31/0232* | (2014.01) |
| *H01L 33/20* | (2010.01) |
| *H01L 33/46* | (2010.01) |
| *H01L 31/054* | (2014.01) |
| *H01L 27/144* | (2006.01) |
| *H01L 31/0352* | (2006.01) |
| *H01L 31/18* | (2006.01) |
| *H01L 33/24* | (2010.01) |
| *H01L 33/32* | (2010.01) |
| *H01L 33/58* | (2010.01) |
| *H01L 33/60* | (2010.01) |

(52) U.S. Cl.
CPC .... *H01L 31/0232* (2013.01); *H01L 31/02325* (2013.01); *H01L 31/02327* (2013.01); *H01L 31/0352* (2013.01); *H01L 31/0547* (2014.12); *H01L 31/1856* (2013.01); *H01L 33/0075* (2013.01); *H01L 33/20* (2013.01); *H01L 33/24* (2013.01); *H01L 33/32* (2013.01); *H01L 33/46* (2013.01); *H01L 33/58* (2013.01); *H01L 33/60* (2013.01); *H01L 2933/0025* (2013.01); *Y02E 10/52* (2013.01)

(58) Field of Classification Search
USPC .............................................. 257/98, 99, 100
See application file for complete search history.

(56) References Cited

U.S. PATENT DOCUMENTS

| | | | | |
|---|---|---|---|---|
| 2002/0141006 | A1* | 10/2002 | Pocius | G02B 5/32 359/15 |
| 2006/0113638 | A1* | 6/2006 | Maaskant | H01L 31/035281 257/623 |
| 2009/0050905 | A1* | 2/2009 | Abu-Ageel | H01L 33/58 257/80 |

OTHER PUBLICATIONS

Maaskant, Light emitting diodes and the manufacture thereof, US20060113638.
Abu-Ageel, Highly Efficient Light-Emitting Diode, US20090050905.
International Search Report for related International Patent Application No. PCT/EP2013/067187, dated Dec. 2, 2013.
United States Office Action, U.S. Appl. No. 14/425,414, dated Jan. 20, 2016, 10 pages.

* cited by examiner

| Geometry | | | Electrical | | | | Thermal | Optical | | | Cost |
|---|---|---|---|---|---|---|---|---|---|---|---|
| Cree Reference efficiency | µHBD optical model | Device Footprint | µHBD emitting area | Drive Current (mA) | Current density change | ΔJ factor | ΔT factor | Theoretical optical flux | Compensated flux | EE | Relative Cost of light |
| 50% | 85% | 100% | 25% | 350 | 4 | -20% | 0% | 43% | 34% | 68% | 294% |
| | | 200% | | | 2 | -10% | 5% | 85% | 84% | 77% | 124% |
| | | 300% | | | 1.33 | -5% | 7% | 128% | 130% | 81% | 77% |
| | | 400% | | | 1 | 0% | 10% | 170% | 187% | 85% | 53% |
| 30% | 85% | 100% | 25% | 350 | 4 | -20% | 0% | 71% | 57% | 68% | 176% |
| | | 200% | | | 2 | -10% | 5% | 142% | 134% | 77% | 75% |
| | | 300% | | | 1.33 | -5% | 7% | 213% | 216% | 81% | 46% |
| | | 400% | | | 1 | 0% | 10% | 283% | 312% | 85% | 32% |

Fig. 8

OPTICAL DEVICE HAVING MESAS FOR LIGHT EXTRACTION ENHANCEMENT

CROSS REFERENCE TO RELATED APPLICATIONS

This application is a continuation of U.S. application Ser. No. 14/425,414, filed Mar. 3, 2015, which is a national stage entry application of international application no. PCT/EP2013/067187, filed Aug. 16, 2013, which claims to United Kingdom Patent Application serial no. 1215632.9, filed Sep. 3, 2012. The entire contents of each of these applications are hereby incorporated by reference.

TECHNICAL FIELD

The invention relates to an optical device. Specifically, the invention relates to, but is not limited to, an optical device with efficient coupling of light between the device and the environment. In specific exemplary devices, the invention relates to, but is not limited to, a light emitting diode (LED) having an improved extraction efficiency (EE).

BACKGROUND OF THE INVENTION

LEDs convert electrical energy into optical energy. In semiconductor LEDs, light is usually generated through recombination of electrons, originating from a first doped semiconductor layer, and holes, originating from a second doped semiconductor layer. In some infra-red emitting semiconductor materials light can be generated by electron intersub-band transitions rather than electron-hole transitions. The area where the main light generation takes place is referred to herein as the active layer, or more generally as the active region.

A major challenge in the field of LEDs is to extract as much of the emitted light as possible from the semiconductor material into the surrounding medium, which may be air.

There are a number of problems with traditional cuboid-shaped LEDs including: 1) most light emitted from the active layer is outside the angle of total internal reflection, which leads to long path lengths for rays; and 2) they suffer from high absorption due to increased path lengths An approach used to improve LED performance is called chip shaping. Higher EEs are possible with this approach. However, it does not eliminate the long path lengths within the LED chip, nor the requirement for an external mirror. Also, the technique is less suitable to the widely used gallium nitride (GaN) based LEDs. The reason for this is that the sapphire and silicon carbide (SiC) substrates commonly used in GaN-based LED chips are very hard materials and are very difficult to shape mechanically, for example, with a dicing saw. In LEDs comprising these materials, it seems not to be a practical solution to shape the whole chip.

Another approach to achieving a high EE is to provide an array of "micro-LEDs", thus keeping the average path length within the device short. Such arrangements are described in U.S. Pat. No. 6,410,940 and U.S. Pat. No. 6,410,942.

Total internal reflection is a common problem for LED devices, as the refractive index of the substrate materials used is typically much greater than air, which typically surrounds the LED. This allows light to escape from only a very narrow range of escape angles (or critical angle range) around the normal to the exit surface. The escape angle is more limited as the difference in refractive index of the materials becomes larger. For typical LED devices, in the simplest case, only approximately 10% of the generated light is extracted. The design challenge is to create a structure which allows more light to be extracted into the air.

Packaging techniques may also be used to enhance the EE of LEDs. For example, the extraction efficiency can be increased by profiling an encapsulant over a packaged semiconductor LED device. The encapsulant may be epoxy or phosphor crudely shaped like a lens. This can improve the EE by around 5 to 10%. Additional 90° lenses placed on a packaged LED device can be used to improve the EE of the device by around 10 to 20%.

Processing approaches that user planar fabrication techniques are preferred by the LED industry as they are compatible high volume manufacturing. Any modification to an LED design should use such techniques.

Surface roughening of the semiconductor surface still maintains a planar concept, and these designs are still considered to be 'planar' in nature. Optimised surface roughening can currently achieve over 50% EE. However, there are limitations to this planar surface roughening approach. Firstly, the design still results in multiple internal reflections before the light escapes. This results in losses, especially reflections on the contact electrodes, even if the reflections are relatively efficient. Secondly, the design typically includes mirrors as part of the electrical contact on the planar surface to enhance the light extraction. This requires additional manufacturing processes.

Sapphire-based semiconductor devices (i.e. a Sapphire substrate) form the basis for the production of the majority of high production volumes and lower power devices. For the larger and higher power devices, the design requirements mean the material properties of the sapphire substrate become more limiting. Thicker substrates are advantageous to allow more light to escape from the sidewalls of the device. Sapphire has a poor thermal conductivity, so the device becomes hotter as the substrate becomes thicker. In terms of thermal management, the limitations of the sapphire substrate can be overcome by removing the semiconductor layer from the sapphire substrate and bonding to another thermally and electrically conducting substrate—a process known as wafer-lift off. This can provide a good thermal management solution. A mirror on the bonding interface is typically employed to improve the light extraction efficiency especially when combined with surface roughening on the exit surface.

In some cases an additional bonded substrate can be fabricated at angles other than 90° such that the reflections on these angled surfaces enhances the light extraction. This can enable an EE of up to around 65%.

A micro-LED structure is proposed in WO 2004/097947 (U.S. Pat. No. 7,518,149) with a high EE because of its shape. Such a micro-LED 100 is shown in FIG. 1, wherein a substrate 102 has a semiconductor epitaxial layer 104 located on it. The epitaxial layer 104 is shaped into a mesa 106. An active (or light emitting) layer 108 is enclosed in the mesa structure 106. The mesa 106 has a truncated top, on a side opposed to a light transmitting or emitting face 110. The mesa 106 also has a near-parabolic shape to form a reflective enclosure for light generated or detected within the device. The arrows 112 show how light emitted from the active layer 108 is reflected off the walls of the mesa 106 toward the light exiting surface 110 at an angle sufficient for it to escape the LED device 100 (i.e. within the angle of total internal reflection).

SUMMARY OF THE INVENTION

The present applicant has identified that achieving an increase in EE is hindered by total internal reflection at the surfaces of the semiconductor, and the applicant's observations on this and related issues are summarised below. In particular, as a result of research into the micro-LED structures set out, for example, in WO 2004/097947 (U.S. Pat. No. 7,518,149), the applicant has observed the following.

The increased EE is achieved by creating a reflector structure (e.g. the mesa) such that a greater portion of the generated light is directed to the exit surface at an incident angle less than the critical angle to the normal, at which light cannot escape.

The design of the mesa profile is an approximation of a parabolic design. The reflector design takes advantage of the high reflection of light seen at the junction between high and low refractive index materials. That is, light incident on the sidewalls of the mesa is reflected toward the light exiting surface.

The technology requires a flat and polished exiting surface to achieve the highest efficiencies. Any surface roughness can act to modify the incident angle outside the critical angle range causing internal reflection not transmission.

The improvement in EE that can be achieved is essentially a factor of two. In terms of the overall light extraction, this allows approximately 20% of the generated light to escape the LED device, when compared with the typical EE of an LED of 10% mentioned above. Other extraction methods (e.g., surface roughening) can currently achieve EEs of greater than 50%.

To form the mesa structure, the epitaxial layer of the LED devices must be etched away. This significantly reduces the area of the active layer available to generate light. This causes a decrease in the light generated per unit area for the same applied current density. Increasing the current to offset this area reduction does not compensate the area reduction, as light output is not linear with increasing current.

The combined increase in EE and reduction in the area that light is generated mean that, even in the best case, an increase in the device surface area of at least a factor of three is necessary to generate the same optical flux, under equivalent electrical forward drive conditions.

The applicant has identified the desirability of improving the performance of micro-LED devices. Specifically, the applicant has identified a desirability to increase both the EE (for example, by more than a factor of two) and total optical flux per unit area extracted from each micro LED device (for example, by more than a factor of three).

According to the invention in a first aspect, there is provided an optical device comprising: a semiconductor material comprising an active layer configured to emit light when an electrical current is applied to the device and/or to generate an electrical current when light is incident on the active layer, wherein the semiconductor material comprises a first surface and an opposed second surface, at which light is emitted from and/or received by the device, and wherein the first surface defines a first structure comprising the active layer and configured to reflect light emitted from the active layer toward the second surface and/or to reflect light received by the device toward the active layer, and the second surface defines a second structure configured to permit light incident on the second surface at an angle outside a critical angle range to the planar normal to pass therethrough.

Optionally, the semiconductor material is an epitaxial layer. That is, the first structure and the second structure are formed on opposed surfaces of the epitaxial layer that comprises the active layer of the device.

Optionally, the epitaxial layer may be mounted on one of a GaN wafer, a Silicon wafer, a sapphire wafer, a silicon carbide wafer, a copper substrate, a ceramic substrate, a glass wafer, a GaA wafer or any other substrate generally used in the industry.

Optionally, the first and/or second structures comprise mesas with truncated tops.

Optionally, the truncated tops of the first and/or second mesas are substantially circular.

Optionally, the first and/or second mesas have a circular footprint and the footprint of the mesa of the second structure has a larger diameter than the footprint of the mesa of the first structure.

Optionally, the truncated tops of the mesa of the second structure has a large diameter than the truncated top of the mesa of the first structure.

Optionally, the first and/or second structures are generally parabolic in cross section. The second structure may have a planar top portion and sidewalls curved inwardly toward the first structure. Generally, the second structure may describe a hemisphere with the top section removed. The second structure may be shaped to cooperate with the first structure to increase the amount of light incident on the second surface able to escape the device.

Optionally, the first and second structures are co-aligned.

Optionally, the second structure covers at least the lateral area covered by the first structure.

Optionally, the second surface defines a Fresnel lens.

Optionally, the optical device further comprises a reflective layer deposited on the first surface to internally reflect light within the device.

Optionally, the reflective layer is electrically conducting and forms an electrical contact for the device.

Optionally, the optical device comprises one of a micro-LED and a photodiode.

According to the invention in a second aspect, there is provided an array of optical devices comprising a plurality of optical devices as described above.

Optionally, the optical devices are formed from a single piece of semiconductor material.

Optionally, a pitch between the optical devices in the array is at least the diameter of the truncated top of the mesa of the second structure.

According to the invention in a third aspect, there is provided a method of making an optical device, the method comprising: providing a semiconductor material comprising an active layer configured to emit light when an electrical current is applied to the device and/or to generate an electrical current when light is incident on the active layer, wherein the semiconductor material comprises a first surface and an opposed second surface, at which light is emitted from and/or received by the device; shaping the first surface to define a first structure comprising the active layer and configured to reflect light emitted from the active layer toward the second surface and/or to reflect light received by the device toward the active layer; and shaping the second surface to define a second structure configured to permit light incident on the second surface at an angle outside a critical angle range to the planar normal to pass therethrough.

Optionally, the semiconductor material is an epitaxial layer on a substrate, and the method may further comprise a wafer lift-off procedure comprising removing the epitaxial layer from the substrate, such that the second surface is accessible.

The wafer lift off procedure may further comprise planarizing the first surface and attaching a second substrate on the planarized first surface.

An optical device is proposed that comprises a semiconductor material having a first surface and an opposed second surface, with both surfaces being structured to increase an extraction efficiency of the device. The first surface is shaped to form a first surface structure which acts as a reflective enclosure for light generated or detected by an active region within or associated with the semiconductor material of the first surface structure. The second surface is shaped to form a second surface structure, with the second surface structure corresponding generally (e.g. in shape and/or position) with the first surface structure.

The first and second surfaces may be considered to be structured so as both to be non-planar.

The second surface structure is co-aligned with the first surface structure.

The first and second surface structures may both form protrusions or concave surface elements when viewed from outside the material.

The second surface structure may have a shape which generally mirrors that of the first surface structure, and/or which is generally an inverted form of the first surface structure.

The first surface structure may be generally dome shaped. The second surface structure may be generally dome shaped.

The first surface structure may be shaped as a mesa with a truncated top. The mesa may have a generally parabolic shape. The second surface structure may be shaped as a sub-mesa with a truncated top, corresponding generally in shape to the mesa of the first surface structure.

The second surface structure may cover at least the lateral area covered by the first surface structure.

The optical device may be a light emitting device or a light receiving device. In this respect, while light emitting devices (e.g. LEDs) convert electrical energy into optical energy, and although the bulk of this disclosure relates to such light emitting devices, it will be readily understood that methods and apparatus disclosed herein can also be applied to the reverse operation, i.e. to light receiving devices (e.g. photodiodes or PDs) that convert optical energy into electrical energy.

The second surface structure may be provided with a shape which takes account of the shape of the first surface structure so as to maximise the light in use which is incident upon the second surface within a critical angle range, the light having emanated from the active layer (in the case of a light emitting device) or falling upon the active layer (in the case of a light receiving device).

The active layer may be a light emitting or receiving region, where the device is light emitting device or a light receiving device respectively.

The second surface may be a light output or input surface, where the device is a light emitting device or a light receiving device respectively.

The reflective enclosure of the first structure may be adapted to reflect light from the active layer in a forward direction (towards the second surface structure) or reflect light received from a forward direction (from the second surface structure) to the active layer, where the device is a light emitting device or a light receiving device respectively.

The first and second surface structures may be formed from the same semiconductor material.

There is also proposed a method of making an optical device, comprising providing a semiconductor material having a first surface and an opposed second surface, shaping the first surface to form a first surface structure to act as a reflective enclosure for light generated or detected by an active region within or associated with the semiconductor material of the first surface structure, shaping the second surface to form a second surface structure, with the second surface structure corresponding generally with the first surface structure.

The method may comprise forming an array of such optical devices on a continuous substrate.

The method may further comprise the step of separating the optical devices of the array into smaller arrays or single devices. Separating may comprise mounting the substrate to a carrier, and using an etch process to separate the devices.

Other features of the invention may include:

1. The formation of light emitting device where both surfaces of the epitaxial layer are non-planar or structured.

2. Both electrical contacts are on one side of the patterned surfaces. Light is extracted from the side without the electrical contacts.

3. The shaping of optical profiles on both surfaces of a semiconductor LED device into the semiconducting material produces high optical extraction efficiency greater than can be achieved by a single side optical profile and a planar surface (unstructured surface).

4. The diameters of the optical profiles are different. The diameter of the sub-mesa is greater than the micro-LED mesa on the opposite surface.

5. Registration of the optical structures is important to achieve the optimum combined benefit. In particular, the central axis of both structures may be the coincident.

6. The thickness of the semiconductor material is dependent on the pitch of the first structure and second structure combination and target optical parameters defined.

7. The manufacture can be extended through the semiconductor material isolating each first structure/second structure providing the electrode side is well mounted. In this way the mesa structures become discrete units.

8. No metal electrode schemes are required on the exit surface. The electrodes can be defined on one side of the semiconductor material.

9. No shadowing due to metal tracking. In this respect, the formation of the second structure may be larger than the first structure. The formation of the first structure naturally exposes the n-GaN semiconductor material. The combination of the material exposure and the planar surface provides the opportunity to create both contacts from one side and allow light to exit unhindered from the other.

By way of summary, micro-LED structures described in WO 2004/097947 (U.S. Pat. No. 7,518,149) have an improved extraction efficiency (EE) because of their shape. The light generated within the mesa has a higher probability of escape through the opposite planar exit surface especially when the near parabolic mesa has a high aspect ratio. The resulting extracted light has also a more directional beam. The micro-LED relies on a flat and smooth or polished exit surface from the semiconductor material to achieve this improvement. Whilst the micro-LED technology can achieve high EE, the design cannot achieve a high total optical flux per unit area. This is because the formation of the micro-LED results in only a small area that generates light relative to the overall device size.

Methods and apparatus disclosed herein describe a further implementation of the micro-LED where the EE is further increased by advantageously structuring the previously flat exit surface by creation of a sub-mesa (second structure). In WO 2004/09794 7 (U.S. Pat. No. 7,518,149) it is disclosed that the sapphire and silicon carbide (SiC) substrates commonly used in GaN-based LED-chips are both very hard materials and very difficult to shape mechanically, for example with a dicing saw. In these material systems it seems not to be a practical solution to shape the whole chip.

Where the structure of the semiconductor material is free-standing and does not include any of these hard materials it is possible to structure both sides of the semiconductor material. The sub-mesa is defined at a precise position relative to the mesa, i.e. the central axis of the mesa and sub-mesa are ideally common. In very general terms, this can be considered a dual lens system. This design allows the light advantageously directed by the first structure toward the second surface to exit as previously described on a planar surface, whilst also allowing light at greater angles than the perpendicular to be also extracted through the exit surface shaped as the sub-mesa.

The combination of the micro-LED structure and the exit surface sub-mesa structure create a highly efficient design that can be realised even if the aspect ratio of the micro-LED mesa is reduced. This is advantageous to achieve high electrical wall plug efficiency (WPE) as well as high optical efficiency because the area of the semiconductor generating light remains relatively high. In this case, the current densities used to drive the light generating regions can be similar to conventional LED devices. Overall, a high total optical flux, high extraction efficiency and relatively narrow beam profile can be achieved that are improvements in existing device designs where at least one surface is still essentially planar.

BRIEF DESCRIPTION OF THE DRAWINGS

The present invention will now be described, by way of example, with reference to the accompanying drawings, in which:

FIGS. 7 and 8 show modelling data.

DETAILED DESCRIPTION

It is noted that the following description refers predominantly to LED devices but the invention should not be limited to such. The invention applies equally to light receiving devices, such as photodiodes. Further, in this specification the term "light" will be used in the sense that it is used in optical systems to mean not just visible light, but also electromagnetic radiation having a wavelength outside that of the visible range.

For micro-LED structures having an active layer enclosed in a mesa structure, the applicant has identified a relationship between the geometrical dimensions of the mesa, the total amount of light generated and the amount of light extracted. In the case of a micro-LED, the directionality (beam profile), is directly linked to the material properties and the difference in refractive indices between the material of the LED and the surrounding medium. The applicant has therefore established that the main areas to improve in a micro-LED design are the total optical flux extracted and the total optical flux per unit area of the device.

After research development activities, the applicant has identified the following.

The main losses in such a micro-LED device are due to the physical size of the active layer. This is not a point source, but a broad area on or near the truncated top surface of the mesa. As the ratio of height to diameter (H/D ratio) for the mesa increases, the efficiency of a micro-LED structure increases, but the total light output decreases per unit area as the actual area of the active layer is smaller. As the H/D ratio decreases, the electrode area increases and more light is generated as less active layer is removed to form the mesa structure. In this case, more light is generated, but not as efficiently extracted by the micro-LED geometry. This is the main area where further advantages can be achieved with low HID ratios.

Figure 1:
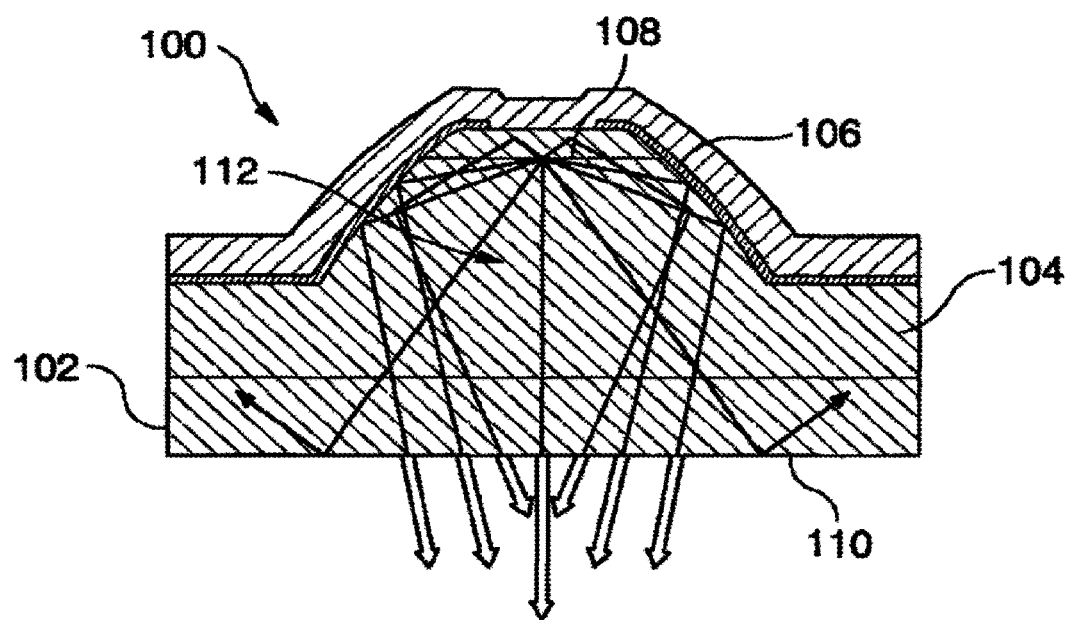
FIG. 1 is a schematic representation of a micro-ED device having an active layer enclosed in a mesa structure.

The term "quasi-collimated" is used herein to define the light confined within the critical escape angle of an LED device. Light generated in the active layer must exit either: (a) directly through an exit face without reflection on the mesa sidewall; (b) via a single reflection on the mesa sidewall resulting in an incident angle to the exit face within the critical angle range; or (c) following multiple reflections within the mesa structure. This is shown in FIG. 1.

Light that is generated by the active layer but is not extracted through the exit surface generally either undergoes multiple reflections on the mesa sidewalls and is incident on the exit surface at an angle that is not transmitted, or is emitted from the active layer at an angle that is not incident on the mesa sidewall and at an angle greater than the critical angle to the exit surface. Multiple reflections can also result in a broader incident angle on the exit surface than single reflections; these are typically transverse around the central axis of the mesa structure and are not sufficiently re-directed by the micro-LED design. In other cases the generated light is typically lost through internal reflections in the device and exits eventually from some other surface on the semiconductor structure or is absorbed within the semiconductor material.

The probability of light generated in the active layer escaping through the exit face decreases as the distance from the mesa central axis of the point in the active layer at which the light is generated increases. This is because a single reflection on the mesa is less likely to be reflected to be incident on the exit surface within the critical angle range, and the mesa design is not able to re-direct the incident light at the extreme positions. If the whole of the top of the mesa is designed to generate light (in the case of low H/D ratio designs), then more light is produced at the extreme positions from the mesa central axis and this is not effectively redirected. There is little additional benefit to this design and the structure is therefore less efficient.

Previous micro-LED structures, in which the light emitting layer is disposed on a mesa offer a performance (efficiency) improvement over a purely planar device through an interaction of EE, radiation profile (beam angle) at the expense of total optical flux per unit area.

Methods and apparatus disclosed herein make significant improvements in total optical flux per unit area. Generally, this may be achieved by defining an additional complementary structure to the micro-LED on an opposite surface (or light emitting surface) of the semiconductor material of the LED. This will be referred to as a second structure, or sub-mesa.

Figure 2A:
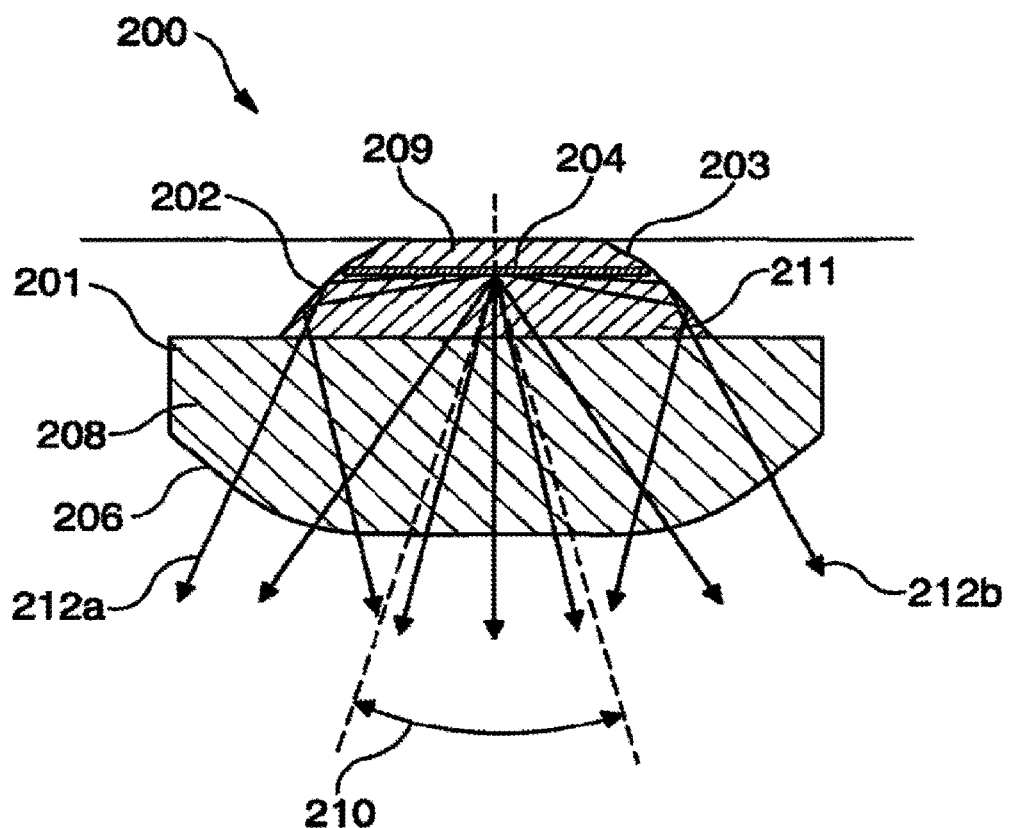
FIGS. 2a and 2b show two cross-sectional views of an optical device structure.
Figure 2B:
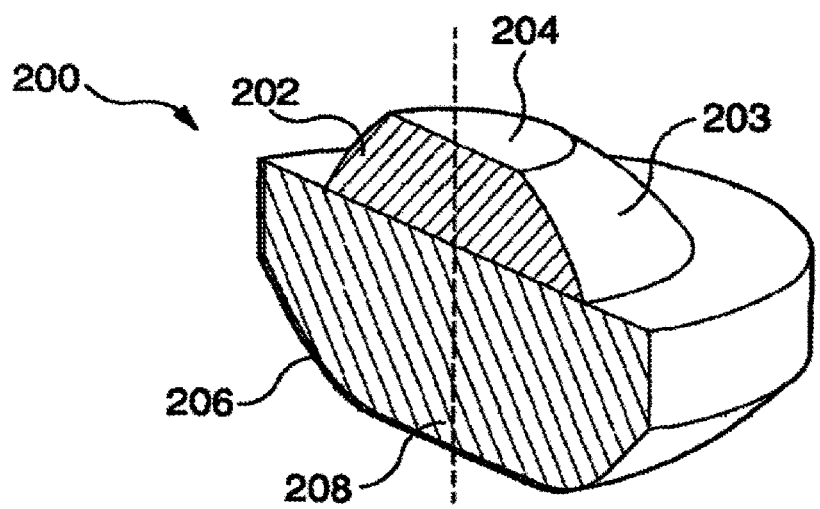

FIGS. 2a and 2b show an optical device, which is a micro-LED structure 200 comprising a semiconductor material 201 having a first surface 202 defining a first structure 203. In the exemplary device of FIGS. 2a and 2b, the first structure 203 is a mesa with a truncated top. The first mesa 203 comprises an active layer 204. A second surface 206 of the device 200 is opposed to the first surface 202. The second surface defines a second structure 208, which in the exemplary device of FIGS. 2a and 2b is a corresponding sub-mesa, or second mesa. The second surface 206 also defines a surface at which light may be emitted from the device 200. It is noted that in a photodiode device, light is received at the second surface 206.

The semiconductor material 201 is formed by a first semiconductor 209 comprising the semiconductor material 201 above the active region 204, and a second semiconductor 211 comprising the semiconductor material 201 below the active region 204. The first and second semiconductors 209, 211 are oppositely doped, that is, one is p doped and the other is n doped. Together, the first and second semiconductors 209, 211 form an epitaxial layer of the device 200. Therefore, methods and apparatus disclosed herein provide an optical device 200 in which opposed surfaces 202, 206 of the epitaxial layer are shaped and profiled.

As can be seen from FIG. 2b, the first mesa 203 is generally parabolic in cross section and has a circular footprint. The second mesa 208 is flat topped with the sides bending inwards toward the semiconductor material so as to ensure that as many of the light rays coming from the active layer 204 hit these bended sides at an angle within a critical range of angles 210 so that the light passes into the surrounding air. That is, the sidewalls of the second mesa 208 are curved such that they present a normal that is always directed toward the active layer 204. This is the case even at points on the second surface 206 that are not axially aligned with a point on the active layer 204.

In the exemplary device of FIGS. 2a and 2b, the mesas 203, 208 are broadly hemispherical with truncated tops, which are circular. The mesa 203 of the first structure has a circular footprint that is smaller than the circular footprint of the mesa 208 of the second structure. The mesas are also co-aligned such that the centre line of the first mesa 203 is coincident with the centre line of the second mesa 208.

The arrows shown in FIG. 2a illustrate light emitted from the active layer 204 of the LED device in a plurality of directions. Some light is emitted from the active layer 204 directly toward the second surface. Other light is reflected from the sidewalls of the first mesa 203 at various other angles toward the second surface 206. Light arriving at the second surface 206 is at an angle to a planar normal, which is a direction normal to a planar surface of the first and/or second structures 203, 208. In the exemplary devices of FIGS. 2a and 2b, the planar surfaces are defined by the truncated tops of the mesas 203, 208 and the planar normal is therefore at right angles to those surfaces.

A critical range of angles 210 is defined and only light incident on the second surface 206 within that critical range of angles 210 is allowed to pass through. The critical range of angles 210 defines a cone in three dimensions. In a device having a completely planar second surface, only light received from the active layer 204, either directly or by reflection, that is within the critical angle range 210 exits the devices. However, as shown in FIG. 2a, by shaping the second surface 206 to have convex curved shape, light that is outside the critical range of angles 210 to the planar normal is allowed to pass through the second surface 206. For example, the light rays represented by arrows 212a and 212b are internally reflected from the first mesa 203 at an angle outside the critical range of angles 210 to the planar normal. However, because that light is incident on a section of the second surface 206 that is curved, they are within a critical range of angles to the normal at that point of the surface. Therefore, the light represented by arrows 212a and 212b is allowed to pass through the second surface 206 and is not reflected.

Figure 3A:
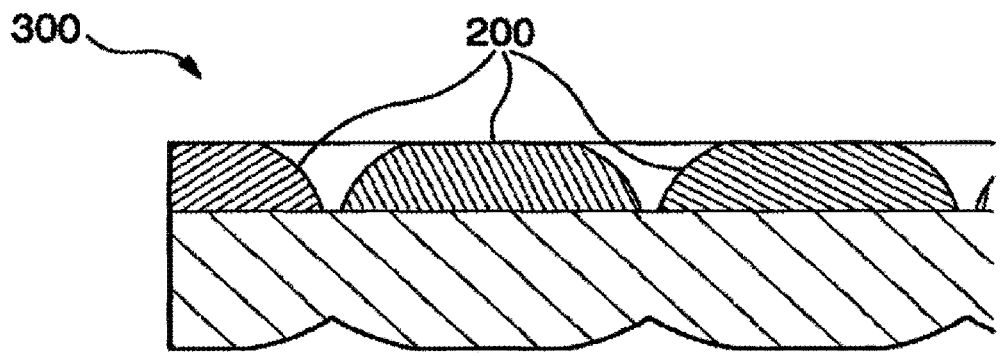
FIGS. 3a and 3b show sectional views of an array of optical structures.
Figure 3B:
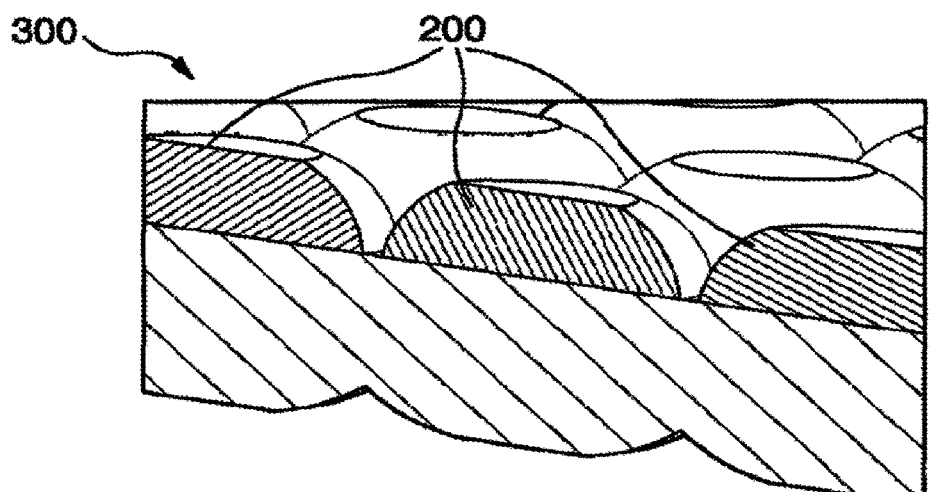

FIGS. 3a and 3b show an array of optical devices 300 comprising a plurality of optical devices 200, which in this exemplary apparatus are micro-LED structures. Each micro-LED structure 200 comprises a first mesa 203 comprising an active layer 204, and a corresponding second mesa 208, as shown in FIGS. 2a and 2b.

The diameters of the first mesa 203 and second mesa 208 are defined as the diameter of the footprint thereof. The array of micro-LEDs of FIGS. 3a and 3b has a pitch equivalent to the second mesa 208 diameter. This results in benefits in the EE due to the second mesa 208 profile, despite the increased pitch between the devices. The adjacent micro-LED devices do not significantly interfere with each other even under these conditions.

An optical device 200 design according to exemplary methods and apparatus and including the second mesa 208, aims to maintain the light extraction advantages already offered by the micro-LED structure (an EE of approximately 20% of the generated light) for: (a) direct (no reflections); and (b) single/multiple reflections on/in the mesa.

In addition, methods and apparatus disclosed having the second mesa 208 design aligned to the first mesa 203 allow at least a portion of the multiple or transverse reflected light to exit the second surface 206. That is, the second mesa 208 is configured to allow light that is incident on the second surface 206 outside the critical range of angles 210 to the planar normal to pass through. This can be achieved by creating an additional profile to the second surface 206 of the semiconductor device 200. The non-planar profile is mainly formed in the regions where light would be incident on the exit surface at angles greater than the critical range of angles 210 and so would be internally reflected by a planar second surface.

The design of such a second surface 206 is complex for the same reasons as the micro-LED mesa definition. The broad emitting area is far from being a point source and so there must be a compromise structure to the ideal lens design for a point source. The basic critical angle range cone 210 still has a range of incident angles from 0 to θ (the critical angle), with the design of the second mesa 208 profile being to effectively modify the 'normal' or θ=0 away from the planar normal to be more advantageous for the incident light. The present applicant has appreciated that this can most effectively (perhaps only) be achieved by defining the second mesa 208 profile into the original semiconductor material. Any additional material would still have a planar interface and so the design would not generally achieve a main aim.

The defined geometrical profile can be considered as a second mesa 208, as there is a strong correlation between the first mesa structure 203 and the corresponding surface profile on the second surface 206. The result is a variation of a two lens system, where the first mesa 203 defines the first lens, and the second mesa 208 the second lens.

The relationship of the second mesa 208 geometry to the first mesa structure 203 is important for increased extraction efficiency. In some embodiments an equivalent Fresnel lens may be used instead of the second mesa 208. It is noted that it has been found that this does not provide the equivalent enhancement of the extraction efficiency. Similarly, a Fresnel lens cannot readily be included as an additional separate structure as this would create a planar interface resulting in further internal reflections.

The combination of the first mesa 203 and the second mesa 208 act to preserve some control of the beam directionality. This is better than a Lambertian beam profile, but not as well defined as having a first mesa 203 alone. This is a design compromise with LED structures as disclosed herein. Generally, a compromise is to be made between high extraction efficiency or a narrow radiation profile.

There is a strong spatial correlation between the first mesa 203 and second mesa 208 designs. For this reason the thickness of the semiconductor material should also be specified and taken into account. With the first mesa 203 alone, the light extraction is independent of the material thickness. This presents an additional confinement to define the performance optimisation to those already presented by known technologies.

In this regard, where the first mesa 203/second mesa 208 combination form a discrete pixel in an array of optical devices, the semiconductor thickness is limited to a value determined by the pitch of the array (or vice versa).

On the other hand, where the first mesa 203/second mesa 208 combination is used in a large area cluster, there is a compromise to be made in the cluster design layout. For high total optical flux per unit area, the H/D ratio of the micro-LED design should be as small as possible, and the pitch as small as possible. These values will then define the optimum semiconductor material thickness. For high efficiency and a narrow beam profile of the exiting light, the choice of micro-LED HID, pitch is defined by the second mesa 208 diameter and the optimum material thickness must be specifically designed in each case.

In an example where the micro-LED design ratio is H/D=0.5, this allows a large electrode area. The maximum ratio of the single emitter area is therefore approximately 25% based on the area of the sub-mesa. This can be used to define an acceptable range for the semiconductor thickness as a multiple of the array pitch.

In exemplary methods and apparatus, the footprint of the second mesa 208 will be larger than the footprint of the first mesa 203 due to the nature of the design requirements. The intersections of the pixels of an array according to a methods and apparatus disclosed herein are defined by the geometry of the second mesa 208 not the mesa structure. In a exemplary methods In designing an LED structure array according to an embodiment, design optimisation may be necessary for the second mesa 208 intersection.

The design can be optimised in other ways. For example, for an efficient wall plug efficiency (WPE) design, maintain the highest p-contact electrode area, priority for the micro-LED design to have as low a H/D ratio as possible. For a narrow radiation profile, increase the HID ratio of the micro-LED and modify the design of the sub-mesa to achieve the desired radiation profile.

The fabrication of the second mesa 208 would typically use the same fabrication techniques as known micro-LED mesa techniques. In this respect, the etch method and profile fabrication techniques can be considered as being common to both mesa and second mesa 208. Registration to the micro-LED is possible through the transparent semiconductor substrate.

To manufacture the first mesa 203/second mesa 208 combination, both structures can be fabricated into the epitaxial layer. In the case where the micro-LED diameter is small, potentially the epitaxial layer can become very thin. Where the pitch of the mesas is large, the thickness of the epitaxial layer can be greater than the height of the first mesa 203 (H) and the depth of the second mesa 208 (M); in this case there is no impact on the mechanical stability of the semiconductor material. Where the pitch of the first mesa 203/second mesa 208 combination is as small as possible, the epitaxial layer thickness is likely to be relatively thin (in the order of 2-10 micrometers). When the height of the first mesa 203 and depth of the second mesa 208 become the same as the thickness of the epitaxial layer, there is the opportunity to isolate each first mesa 203/second mesa 208 combination; in this case, the mechanical stability of the overall device can be provided as part of the electrical contacts.

The optical devices in the array can be operated as clusters (i.e., all working in unison to create more light) for applications such lighting. The optical devices in the array can be operated as individually addressable arrays (i.e., each pixel individually switchable) for applications such as printing. The first side structures (mesa height, mesa diameter, location of epitaxial layer within the mesa structure, exact parabolic structure, pitch between pixels) and the second side structures (mesa/lens shape, mesa/lens diameter, mesa/lens pitch, mesa/lens height) can be optimized to prioritise the optical device performance (e.g., lumens/watt, efficiency, lumens per unit area, optical beam half/angle, collimation). If the optical device emits at UV wavelengths (200 nm to 385 nm), the distance light travels within the die before emerging is critical to the device's efficiency. The semiconductor/substrate itself absorbs the light (i.e. EE is very low) and this is a major technical challenge in such devices. Therefore a solution that does not restrict the light bouncing around within the chip does not increase EE. The methods and apparatus disclosed maximize EE in UV generating LEDs.

As mentioned in WO 2004/097947 (U.S. Pat. No. 7,518, 149), the design and fabrication techniques are suitable for all semiconductor materials systems where the light can be extracted through a transparent bottom or base material. Examples of such systems are: GaN/GaN, GaN/Silicon, GaN/sapphire, GaN/SiC, InGaAs/GaAs, and InGaAsP/InP. An embodiment of the invention applies to either p-type doped semiconductor above the active layer, and n-type doped semiconductor below the active layer, or with n-type doped semiconductor above the active layer, and p-type doped semiconductor below the active layer. If the manufacturing process uses wafer life-off approaches, or this process is introduced into the production process, both surfaces of the substrate are conveniently accessible during the fabrication process so that the mesa and sub-mesa may both be formed during the fabrication process.

Electrical contacts can both be formed on the first mesa 203 side of the semiconductor material. This is advantageous in that the light extracted through the exit surface is not shadowed by the tracking pattern.

One possible manufacturing process flow is as follows:
A. Micro-LED (e.g. first mesa 203) fabrication, as described in WO 2004/097947 (U.S. Pat. No. 7,518,149)
B. N-metal contact formation
C. Planarization (optional)
D. Final mount assembly
E. Substrate removal
(D&E being wafer lift-off)
F. Second mesa 208 fabrication (similar to that for the micro-LED)
  a. Etch mask definition
  b. GaN (semiconductor) Etch
  c. Mask removal Methods and apparatus disclosed herein may be based on, and may build on, the methods and apparatus of WO 2004/097947 (U.S. Pat. No. 7,518,149), and in view of this the entire content of WO 2004/097947 (U.S. Pat. No. 7,518,149) is hereby incorporated by reference, in a manner sufficient to provide support for any claims included in the present application now or in the future and to provide basis for any amendments to the present application.

A method of fabricating an optical device 200 is described with reference to FIGS. 4 and 5a-5e. A semiconductor material 201 comprising oppositely doped first and second semiconductors 209, 211 is provided 400. The semiconductor material forms an epitaxial layer and comprises an active layer 204 configured to emit light when an electrical current is applied to the device and/or to generate an electrical current when light is incident on the active layer. The epitaxial layer is positioned on a substrate 500. The substrate 500 may comprise a semiconductor material and, although it is not shown this way in FIGS. 5a-e for clarity, is typically one or two orders of magnitude thicker than the epitaxial layer. Typically, the thickness of the epitaxial layer is in a range from 2-10 micrometers and the substrate is in the order of a few hundred micrometers.

Figure 5A:
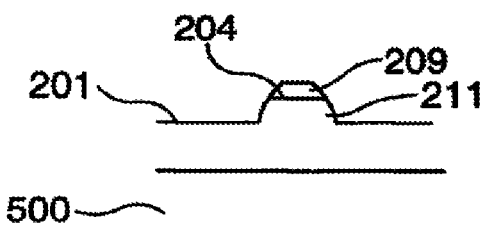
FIGS. 5a-5e show structures arising during a fabrication process.

The first surface 202 is shaped 402 to form the first structure (or mesa) 203. This may be done by etching and methods suitable are set out in WO 2004/097947. FIG. 5a shows schematically the resulting structure after the first mesa 203 has been etched.

Figure 5B:
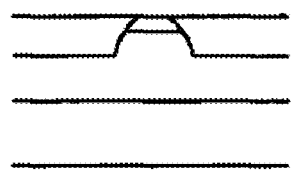

The first surface 202 is planarized 404 (Using BCB-bisbenzocyclobutane or similar) to fill in the regions surrounding the first mesa 203. Typically, a plurality of optical devices 200 are fabricated on a wafer and planarization fills the gaps between the mesas 203 to provide a flat surface. This is shown in FIG. 5b.

Figure 5C:
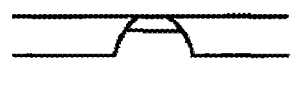
Figure 5D:
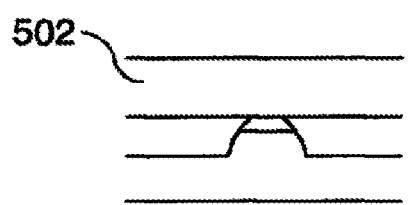

A wafer lift off process 406, 408 is undertaken. This removes 406 the substrate 500 from the second surface 206 of the epitaxial layer to expose the second surface for shaping. This is shown in FIG. 5c. Then, a further substrate (or carrier) 502 is attached 408 on the planarized first surface 202. The new substrate 502 provides structural rigidity to the device and is shown in FIG. 5d.

Figure 5E:
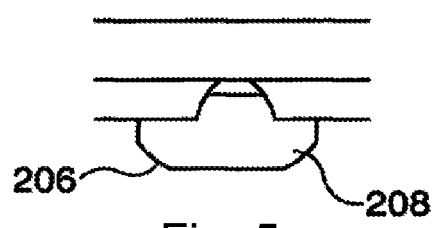
Figure 7:
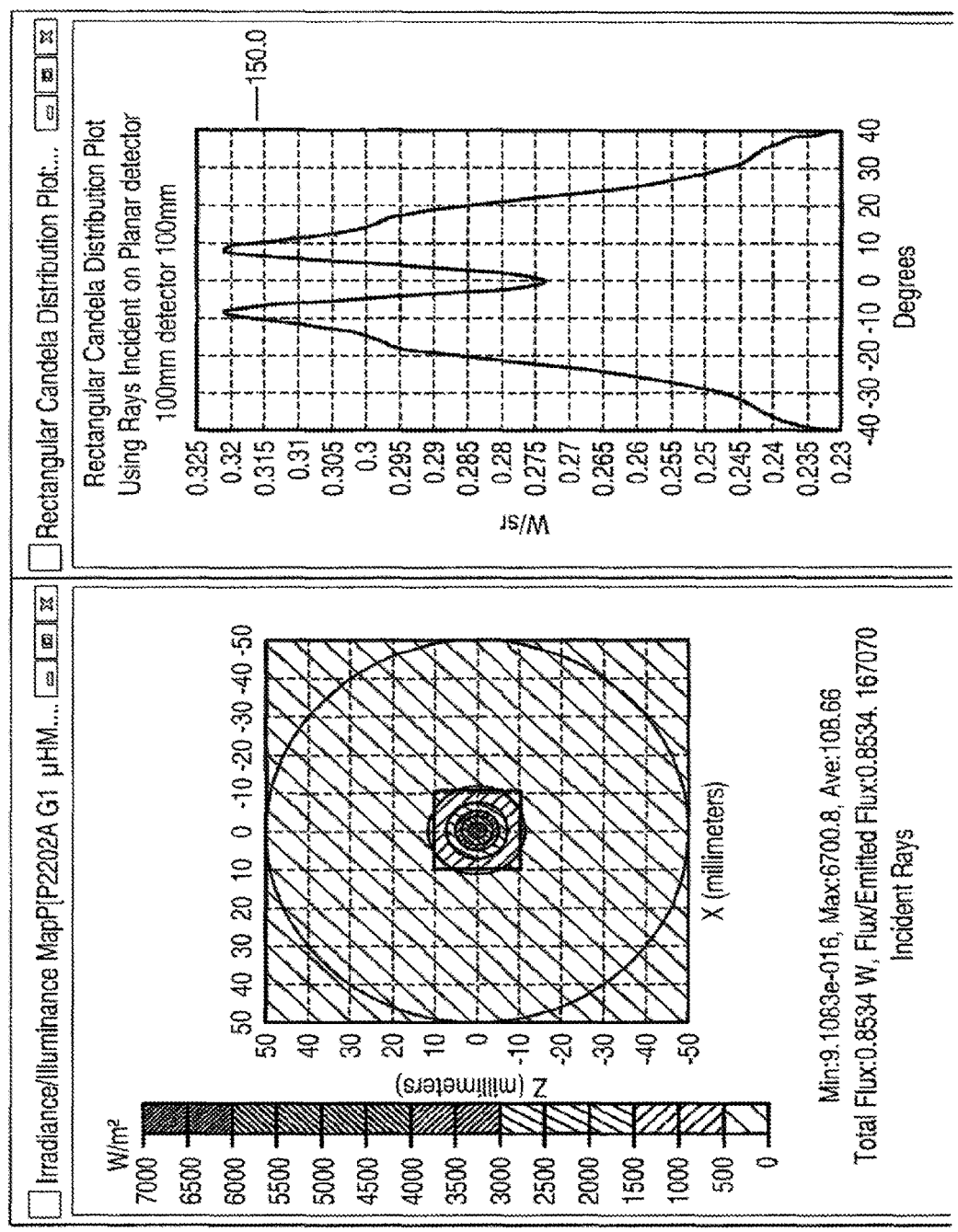

The second surface is shaped 410 to form the second structure (or mesa) 208. This may be done by etching using standard fabrication methods. The resulting optical device is shown in FIG. 5e.

Figure 4:
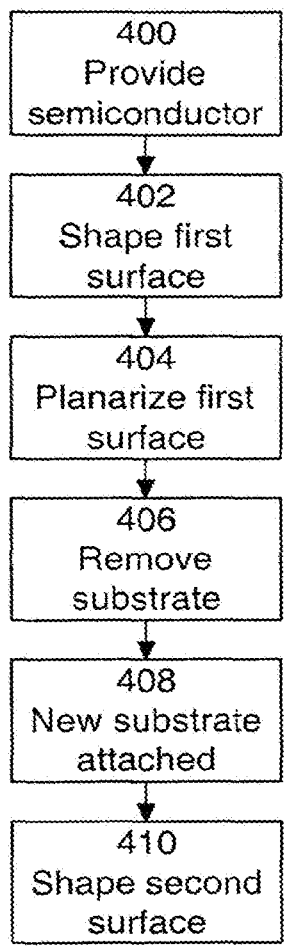
FIG. 4 shows a method for fabricating an optical device.

For clarity, many of the steps are not shown in FIG. 4, although these will be known to the skilled person. Similarly, many further features will be required in FIG. 5e to make the device 200 operational, but these are not shown, for clarity purposes.

The structuring of the second surface structure 208 is enabled if the epitaxial layer is removed and attached to a carrier wafer (wafer lift off technologies) that exposes the inner side of the epitaxial layer enabling further processing/etching using 'normal' or typical LED processing approaches (e.g., planar fabrication techniques). Such wafer lift off processing techniques are a core component of GaN on Si wafer processing, making the methods and apparatus disclosed specifically compatible with GaN on Si LED technologies.

Figure 6:
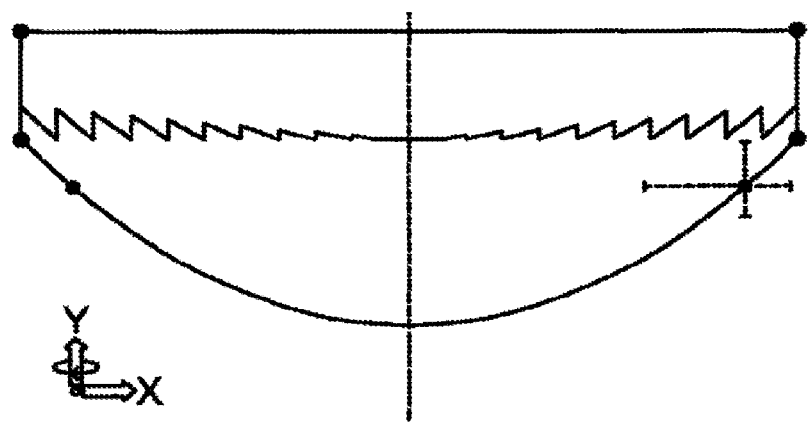
FIG. 6 shows a Fresnel lens second-mesa.

In modelling, the methods and apparatus disclosed herein have shown an EE of around 85%, as shown in FIGS. 5 and 6.

Whilst specific embodiments of the invention are described hereinbefore, it will be appreciated that a number of modifications and alterations may be made thereto without departing from the scope of the invention.

What is claimed is:

1. An optical device comprising:
 a semiconductor material comprising an active layer configured to emit light when an electrical current is applied to the device or to generate an electrical current when light is incident on the active layer,
 wherein the semiconductor material comprises a first surface and an opposed second surface, at which light is emitted from or received by the device,
 and wherein the first surface defines a first structure comprising the active layer and configured to reflect light emitted from the active layer toward the second surface or to reflect light received by the device toward the active layer, the second surface defines a second structure configured to permit light incident on the second surface at an angle outside a critical angle range to a planar normal to pass therethrough, the second structure includes a mesa with a truncated top, and the planar normal is defined in a direction normal to a surface defined by the truncated top of the second structure.

2. The optical device according to claim 1, wherein the semiconductor material is an epitaxial layer of the device.

3. The optical device according to claim 1, wherein the first structure comprises a mesa with a truncated top.

4. The optical device according to claim 3, wherein the truncated tops of the mesas are substantially circular.

5. The optical device according to claim 3, wherein the mesas have a circular footprint and the footprint of the mesa of the second structure has a larger diameter than the footprint of the mesa of the first structure.

6. The optical device according to claim 3, wherein the truncated tops of the mesa of the second structure has a larger diameter than the truncated top of the mesa of the first structure.

7. The optical device according to claim 1, wherein the first structure or the second structures is generally parabolic in cross section.

8. The optical device according to claim 1, wherein the first and second structures are co-aligned.

9. The optical device according to claim 1, wherein the second structure covers at least the lateral area covered by the first structure.

10. The optical device according to claim 1, wherein the second surface defines a Fresnel lens.

11. The optical device according to claim 1, further comprising a reflective layer deposited on the first surface to internally reflect light within the device.

12. The optical device according to claim 11, wherein the reflective layer is electrically conducting and forms an electrical contact for the device.

13. The optical device according to claim 1, wherein the optical device comprises one of a micro-LED and a photodiode.

14. An array of optical devices comprising a plurality of optical devices, each optical device comprising:
 a semiconductor material comprising an active layer configured to emit light when an electrical current is applied to the device or to generate an electrical current when light is incident on the active layer;
 wherein the semiconductor material comprises a first surface and an opposed second surface, at which light is emitted from or received by the device,
 and wherein the first surface defines a first structure comprising the active layer and configured to reflect light emitted from the active layer toward the second surface or to reflect light received by the device toward the active layer, and the second surface defines a second structure configured to permit light incident on the second surface at an angle outside a critical angle range to a planar normal to pass therethrough, the second structure includes a mesa with a truncated top, and the planar normal is defined in a direction normal to a surface defined by the truncated top of the second structure.

15. The array of optical devices according to claim 14, wherein the optical devices are formed from a single piece of semiconductor material positioned on a substrate.

16. The array of optical devices according to claim 14, wherein a pitch between the optical devices in the array is at least the diameter of the truncated top of the mesa of the second structure.

17. A method of making an optical device, the method comprising:
    providing a semiconductor material comprising an active layer configured to emit light when an electrical current is applied to the device or to generate an electrical current when light is incident on the active layer, wherein the semiconductor material comprises a first surface and an opposed second surface, from which light is emitted from or received by the device;
    shaping the first surface to define a first structure comprising the active layer and configured to reflect light emitted from the active layer toward the second surface or to reflect light received by the device toward the active layer; and
    shaping the second surface to define a second structure configured to permit light incident on the second surface at an angle outside a critical angle range to a planar normal to pass therethrough, the second structure including a mesa with a truncated top, and the planar normal being defined in a direction normal to a surface defined by the truncated top of the second structure.

18. The method according to claim 17, wherein the semiconductor material is an epitaxial layer positioned on a substrate, and wherein the method further comprises a wafer lift-off procedure comprising removing the epitaxial layer from the substrate, such that the second surface is accessible.

19. The method according to claim 18, wherein the wafer lift off procedure further comprises planarizing the first surface and forming a second substrate on the planarized first surface.

* * * * *

UNITED STATES PATENT AND TRADEMARK OFFICE
CERTIFICATE OF CORRECTION

PATENT NO. : 9,941,328 B2
APPLICATION NO. : 15/248601
DATED : April 10, 2018
INVENTOR(S) : Nick Shepherd It is certified that error appears in the above-identified patent and that said Letters Patent is hereby corrected as shown below:

In the Claims

Column 14, Line 33, after "truncated," delete "tops" and insert -- top --.

Signed and Sealed this
Twenty-fifth Day of September, 2018

Andrei Iancu
*Director of the United States Patent and Trademark Office*